(12) United States Patent
Jeon (10) Patent No.: US 8,003,988 B2
(45) Date of Patent: Aug. 23, 2011

(54) THIN FILM TRANSISTOR ARRAY PANEL AND METHOD FOR MANUFACTURING THE SAME

(75) Inventor: Sang-Jin Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 78 days.

(21) Appl. No.: 12/612,448

(22) Filed: Nov. 4, 2009

(65) Prior Publication Data

US 2010/0163880 A1 Jul. 1, 2010

(30) Foreign Application Priority Data

Dec. 30, 2008 (KR) .................. 10-2008-0136614

(51) Int. Cl.
*H01L 29/04* (2006.01)
*H01L 29/10* (2006.01)
*G02F 1/1333* (2006.01)
*H01L 21/00* (2006.01)

(52) U.S. Cl. ............ 257/59; 257/72; 257/E29.117; 257/E29.151; 257/E51.005; 438/30; 349/43; 349/54

(58) Field of Classification Search ............ 257/59, 257/E29.151, E51.005, E29.117, 72; 438/30; 349/43, 54

See application file for complete search history.

(56) References Cited

U.S. PATENT DOCUMENTS

| 7,755,088 B2 * | 7/2010 | Kobayashi et al. ............ 257/59 |
| 2006/0197885 A1 * | 9/2006 | Tseng et al. .................... 349/54 |
| 2007/0029615 A1 * | 2/2007 | Lai ................................ 257/355 |

* cited by examiner

*Primary Examiner* — Long Tran
(74) *Attorney, Agent, or Firm* — H.C. Park & Associates, PLC (57) ABSTRACT

A thin film transistor array panel comprises a repair line disposed in a peripheral area of a display area and being configured to repair when at least one of a gate line and a data line are disconnected, and a detour line disposed in the peripheral area and comprising at least one resistor having higher resistance than a remaining portion of the detour line, wherein both ends of the detour line are connected to the repair line to protect the array panel.

14 Claims, 6 Drawing Sheets

THIN FILM TRANSISTOR ARRAY PANEL AND METHOD FOR MANUFACTURING THE SAME

CROSS REFERENCE TO RELATED APPLICATION

This application claims priority from and the benefit of Korean Patent Application No. 10-2008-0136614, filed on Dec. 30, 2008, which is hereby incorporated by reference as if fully set forth herein.

BACKGROUND OF THE INVENTION

1. Field of the Invention

The present invention relates to a thin film transistor array panel and a manufacturing method thereof.

2. Discussion of the Background

A liquid crystal display generally displays images by controlling light transmittance of liquid crystals using an electric field. For this purpose, the liquid crystal display includes a liquid crystal panel formed with pixels arranged in a matrix shape and a driving circuit for driving the liquid crystal panel. The liquid crystal panel includes a thin film transistor array display panel and a color filter array display panel facing each other, a spacer for uniformly maintaining a cell gap between the two display panels, and a liquid crystal layer filled in the cell gap.

To manufacture the liquid crystal display, a large mother substrate may be divided into several cell regions, and thin film elements such as gate lines, data lines, thin film transistors, and pixel electrodes are formed in each region through formation and patterning of thin films. For the patterning, photo-etching or photolithography is used. In the process of forming the thin film elements, externally generated static electricity may flow inside the cell region and the thin film elements may be damaged. Accordingly, a method for preventing the inflow of the static electricity is required.

Recently, the interval between the cell regions has been designed to be narrow to increase the usage efficiency of the mother substrate such that there is less area therebetween, so it is easy for the static electricity to penetrate inside the cell region.

SUMMARY OF THE INVENTION

Exemplary embodiments of the present invention provide protection of the thin film elements from the static electricity generated in the manufacturing process of the thin film transistor array panel.

Additional features of the invention will be set forth in the description which follows, and in part will be apparent from the description, or may be learned by practice of the invention.

An exemplary embodiment of the present invention discloses a thin film transistor array panel that comprises an insulation substrate that comprises a display area and a peripheral area. A thin film transistor is disposed in the display area and a gate line is disposed in the display area and connected to the thin film transistor. A data line is disposed in the display area and connected to the thin film transistor. A pixel electrode is disposed in the display area and is connected to the thin film transistor. A first repair line is disposed in the peripheral area and is configured for repair when at least one of the gate line and the data line is disconnected. A first detour line is disposed in the peripheral area and comprises at least one first resistor having a higher resistance than a remaining portion, wherein the first detour line comprises two ends and both ends of the first detour line are connected to the first repair line.

An exemplary embodiment of the present invention also discloses a thin film transistor array panel that comprises an insulation substrate that comprises a display area and a peripheral area. A thin film transistor is disposed in the display area. A gate line is disposed in the display area and is connected to the thin film transistor. A data line is disposed in the display area and is connected to the thin film transistor. A pixel electrode is disposed in the display area and is connected to the thin film transistor. A first repair line is disposed in the peripheral area and is configured for repair when at least one of the gate line and the data line is disconnected. A first detour line is disposed in the peripheral area, wherein the first detour line comprises two ends and both ends of the first detour line are connected to the first repair line, and a first diode is connected between the first detour line and the first repair line.

An exemplary embodiment of the present invention also discloses a method for manufacturing a thin film transistor array panel comprising: forming a thin film element comprising a gate line, a data line, and a thin film transistor in each cell region on a mother substrate comprising a plurality of cell regions. Forming a guide ring enclosing the periphery of each cell region; and cutting the portion where the guide ring is formed to separate each cell region, wherein the guide ring includes a group of a plurality of point-type conductors that are spaced apart from each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region, or substrate is referred to as being "on" or "connected to" another element, it can be directly on or directly connected to the other element or intervening elements may be present. In contrast, when an element is referred to as being "directly on" or "directly connected to" another element, there are no intervening elements present.

Figure 1:
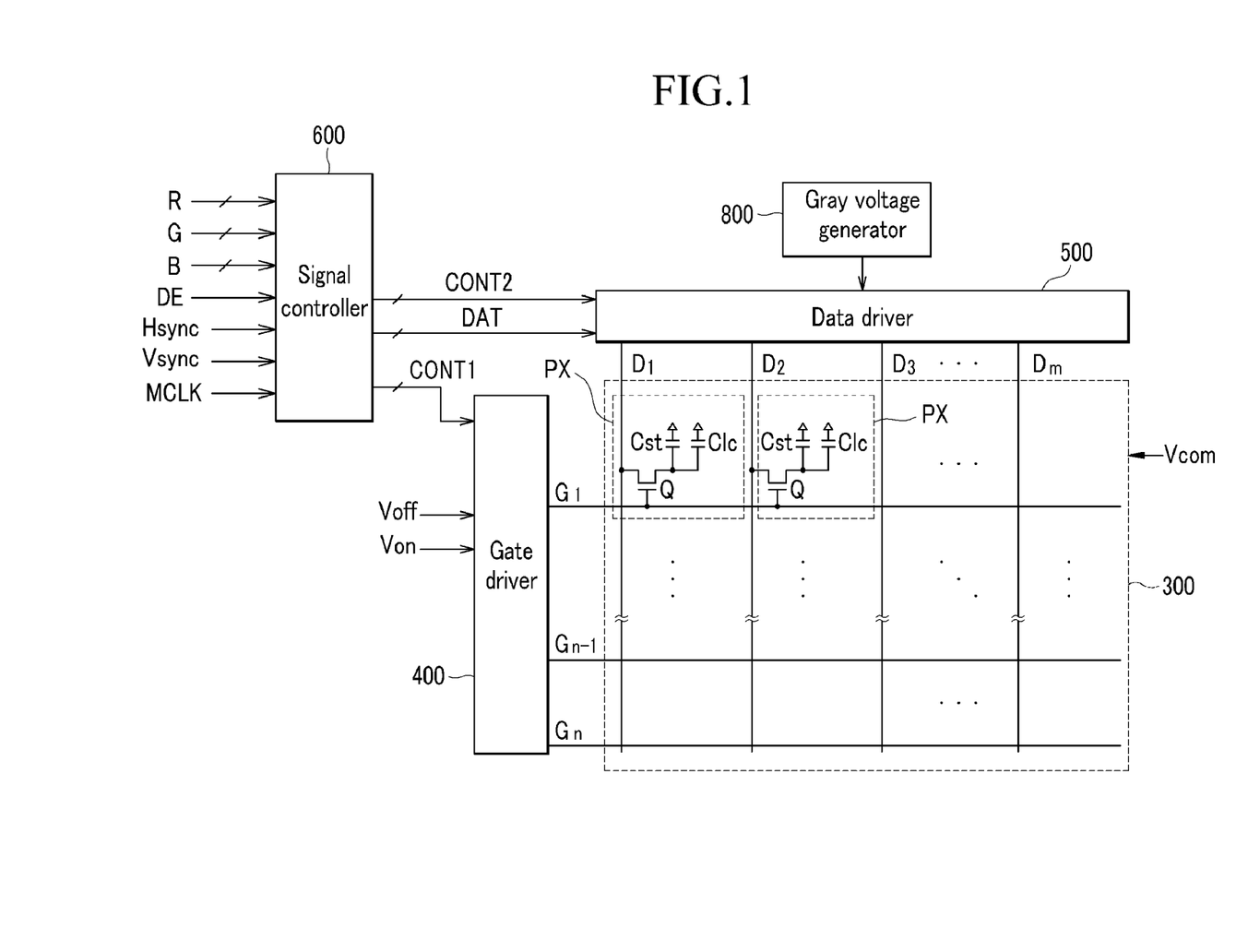
FIG. 1 is a block diagram of a liquid crystal display according to an exemplary embodiment of the present invention.
Figure 2:
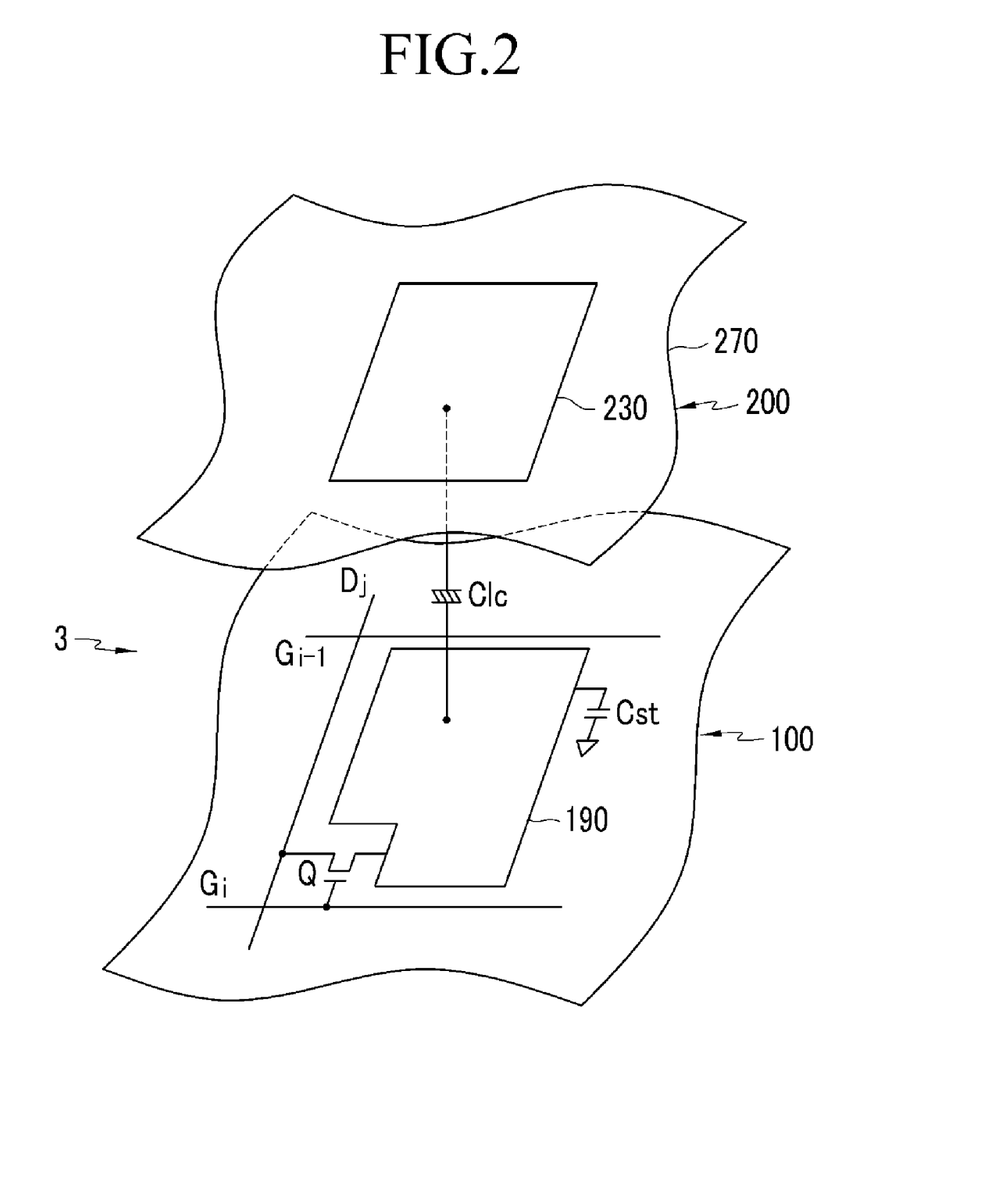
FIG. 2 is an equivalent circuit diagram of one pixel in a liquid crystal display according to an exemplary embodiment of the present invention.

FIG. 1 is a block diagram of a liquid crystal display according to an exemplary embodiment of the present invention, and FIG. 2 is an equivalent circuit diagram of one pixel in a liquid crystal display according to an exemplary embodiment of the present invention.

As shown in FIG. 1, a liquid crystal display according to an exemplary embodiment of the present invention includes a liquid crystal panel assembly 300, a data driver 500 and a gate driver 400 connected thereto, a gray voltage generator 800 connected to the data driver 500, and a signal controller 600 controlling them.

Referring to FIG. 1, in an equivalent circuit, the liquid crystal panel assembly 300 includes a plurality of display signal lines G1-Gn and D1-Dm, and a plurality of pixels PX that are connected to the plurality of signal lines G1-Gn and D1-Dm and are arranged in an approximate matrix shape.

The display signal lines G1-Gn and D1-Dm include a plurality of gate lines G1-Gn that transmit gate signals (referred to as "scanning signals"), and a plurality of data lines D1-Dm that transmit data signals. The gate lines G1-Gn extend substantially in a row direction and are substantially parallel to each other, and the data lines and D1-Dm extend substantially in a column direction and are substantially parallel to each other.

Each pixel PX includes a switching element Q connected to the respective display signal lines G1-Gn and D1-Dm, and a liquid crystal capacitor Clc and a storage capacitor Cst connected to the switching element Q. The storage capacitor Cst may be omitted if necessary.

The switching element Q is a three terminal element such as a thin film transistor that is provided in a lower panel 100 (FIG. 2). Each switching element Q comprises a control terminal connected to the respective gate line G1-Gn, an input terminal connected to the respective data line D1-Dm, and an output terminal connected to the respective liquid crystal capacitor Clc and the respective storage capacitor Cst.

Referring to FIG. 2, the liquid crystal capacitor Clc includes a pixel electrode 190 on the lower panel 100, a common electrode 270 on an upper panel 200, and a liquid crystal layer 3 as a dielectric between the pixel electrode 190 and the common electrode 270. The pixel electrode 190 is connected to the switching element Q, and the common electrode 270 covers the entire surface of the upper panel 200 and is supplied with a common voltage Vcom. Differently from FIG. 2, the common electrode 270 may be provided on the lower panel 100. At this time, at least one of the pixel electrode 190 and the common electrode 270 may have a shape of a bar or a stripe.

The storage capacitor Cst is an auxiliary capacitor for the liquid crystal capacitor Clc. The storage capacitor Cst may include the pixel electrode 190 and a separate signal line, which is provided on the lower panel 100, overlaps the pixel electrode 190 via an insulator, and is supplied with a predetermined voltage such as the common voltage Vcom. Alternatively, the storage capacitor Cst may include the pixel electrode 190 and an adjacent gate line called a previous gate line, which overlaps the pixel electrode 191 via an insulator.

For color display, each pixel PX uniquely represents one color of primary colors (i.e., spatial division) or each pixel PX sequentially represents the primary colors in turn (i.e., temporal division) such that a spatial or temporal sum of the primary colors is recognized as a desired color. FIG. 2 shows an example of the spatial division in which each pixel PX includes a color filter 230 representing one of the primary colors of red, green, or blue in an area of the upper panel 200 facing the pixel electrode 190. Alternatively, the color filter 230 may be provided on or under the pixel electrode 190 on the lower panel 100.

At least one polarizer (not shown) for polarizing light is attached to an outer surface of at least one of the lower panel 100 and the upper panel 200.

The gray voltage generator 800 generates two sets of gray voltages (hereinafter referred to as "reference gray voltages") related to the transmittance of the pixels PX. One of the two sets may have a positive value and the other may have a negative value with respect to the common voltage Vcom.

The gate driver 400 is connected to the gate lines G1-Gn of the liquid crystal panel assembly 300 and applies gate signals, which are a combination of a gate-on voltage Von and a gate-off voltage Voff, to the gate lines G1-Gn. The gate driver 400 generally includes a plurality of integrated circuits (ICs).

The data driver 500 is connected to the data lines D1-Dm of the liquid crystal panel assembly 300 and selects gray voltages supplied from the gray voltage generator 800, applies the selected gray voltages to the data lines D1-Dm as data signals, and generally includes a plurality of ICs.

The signal controller 600 controls the operation of the gate driver 400 and the data driver 500.

In this exemplary embodiment of the liquid crystal display, the lower panel 100 of the liquid crystal panel assembly 300 includes a repair line for repairing a disconnection of the data lines D1-Dm. The repair line is also provided with a static electricity preventer for preventing the thin film elements such as the thin film transistor of the lower panel 100 from being damaged by the static electricity flowing in from the outside.

Next, the static electricity preventer of the liquid crystal display according to an exemplary embodiment of the present invention will be described with reference to FIG. 3, FIG. 4, FIG. 5, FIG. 6, and FIG. 7.

Figure 3:
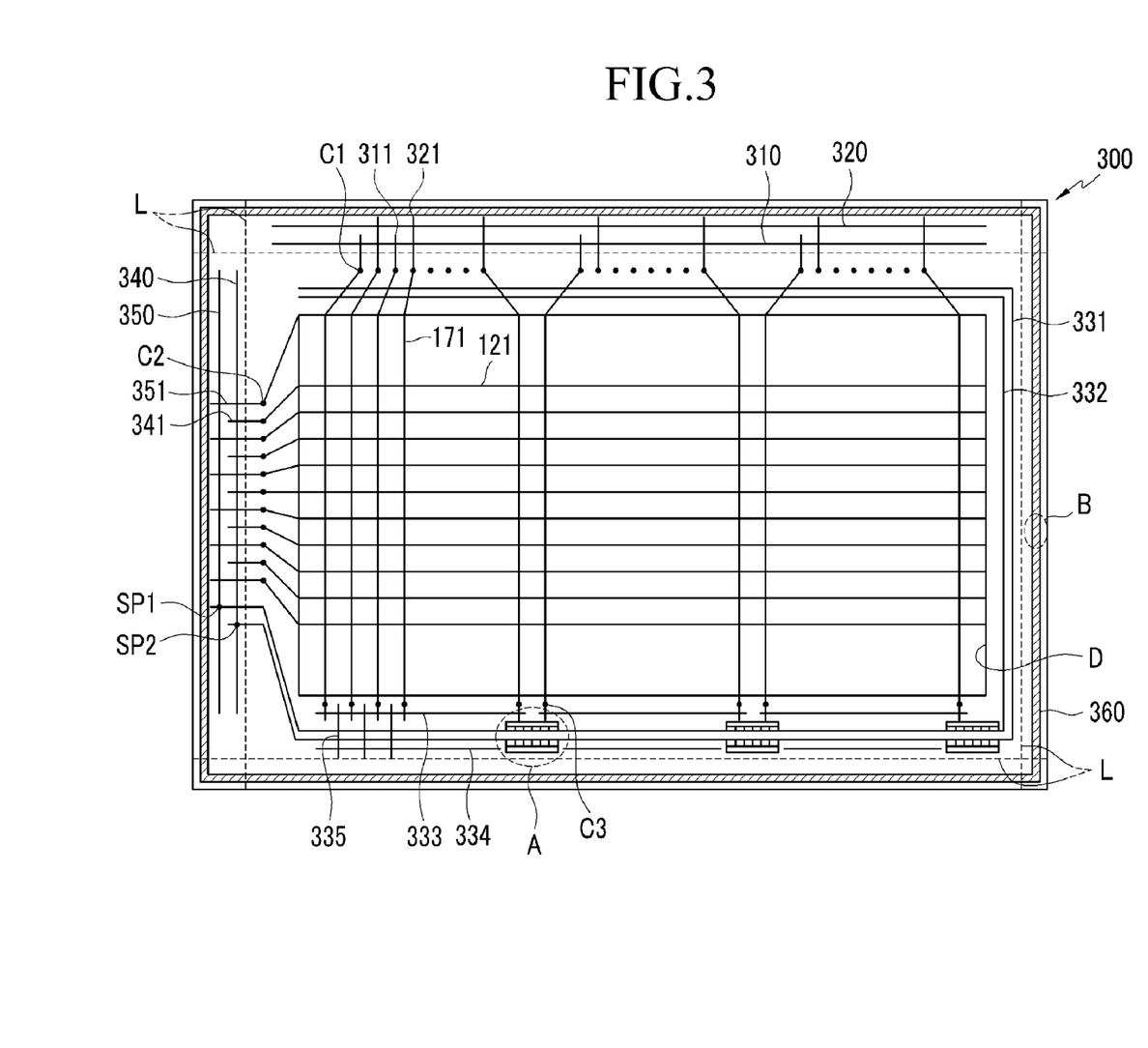
FIG. 3 is a schematic diagram of one cell region in a manufacturing process of a thin film transistor array panel for a liquid crystal display according to an exemplary embodiment of the present invention.
Figure 4:
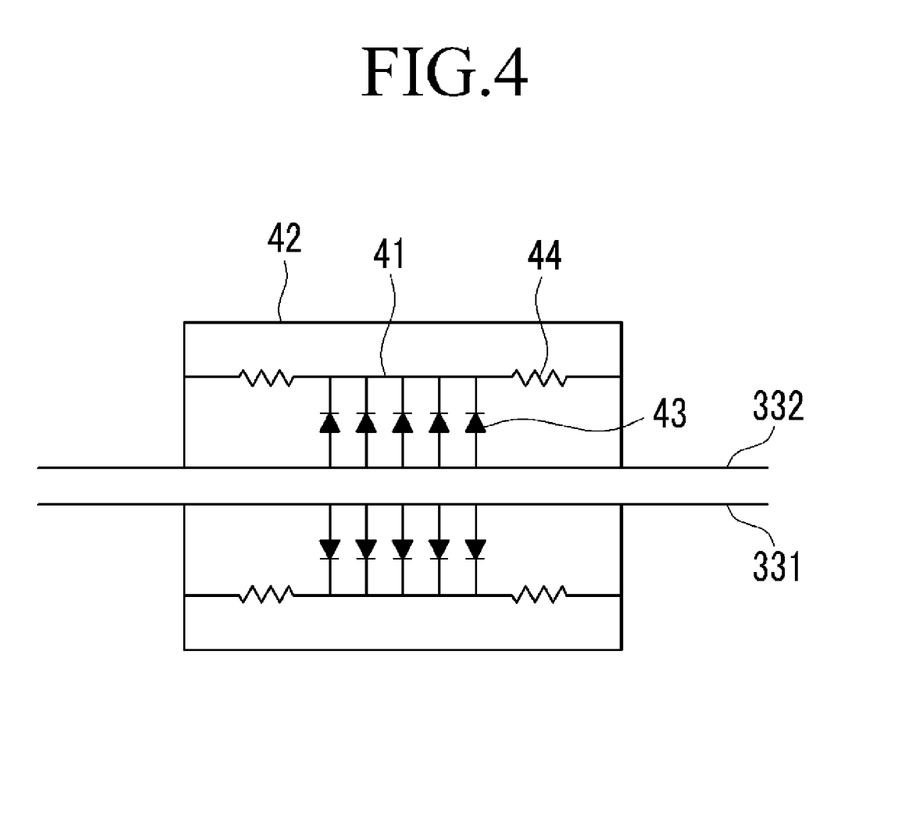
FIG. 4 is an enlarged circuit diagram of the "A" portion shown in FIG. 3.
Figure 5:
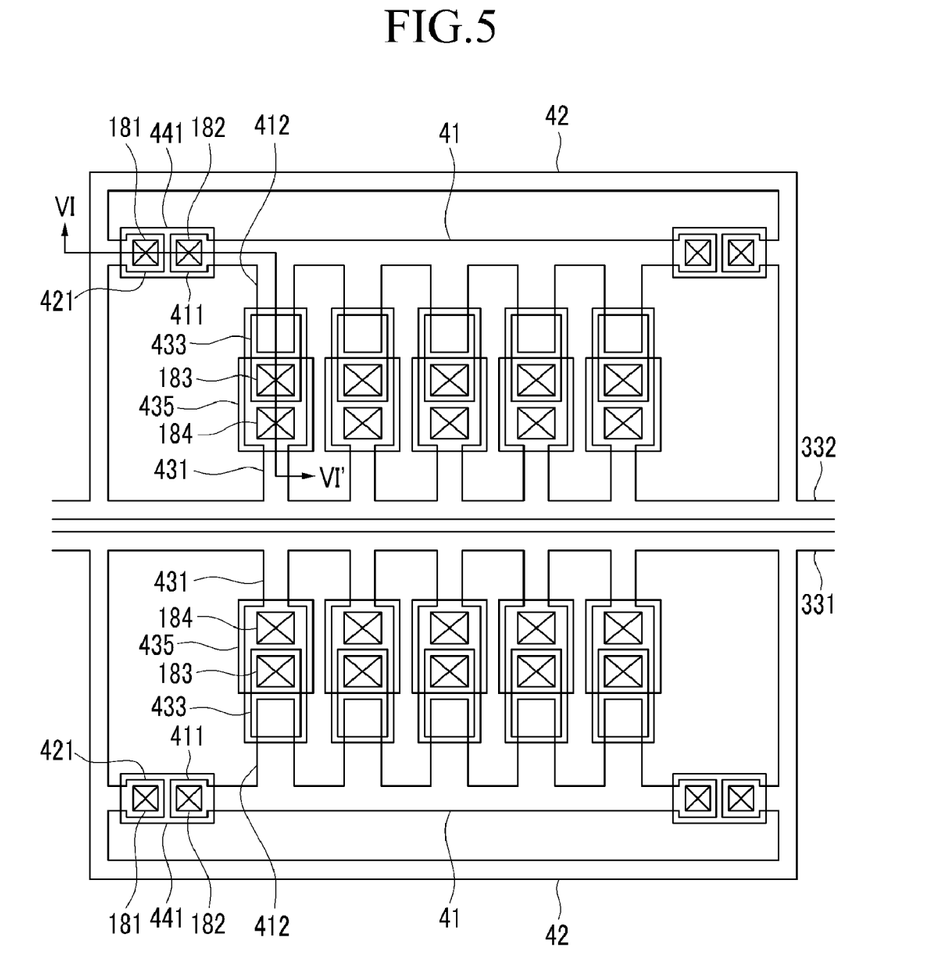
FIG. 5 is a layout view of the "A" portion shown in FIG. 3.
Figure 6:
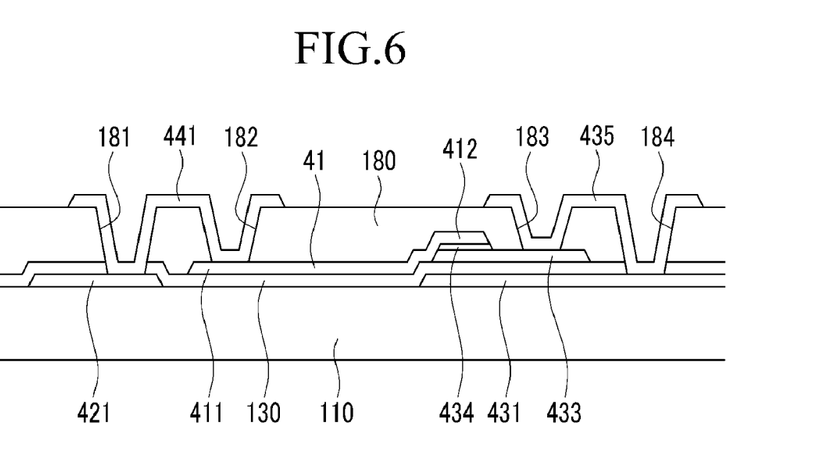
FIG. 6 is a cross-sectional view taken along line VI-VI' of FIG. 5.

FIG. 3 is a schematic diagram of one cell region in a manufacturing process of a thin film transistor array panel for a liquid crystal display according to an exemplary embodiment of the present invention, FIG. 4 is an enlarged circuit diagram of the "A" portion shown in FIG. 3, FIG. 5 is a layout view of the "A" portion shown in FIG. 3, and FIG. 6 is a cross-sectional view taken along line VI-VI' of FIG. 5.

As shown in FIG. 3, in the cell region for the thin film transistor array panel of the liquid crystal display according to an exemplary embodiment of the present invention, data line shorting bars 310 and 320 and gate line shorting bars 340 and 350 are disposed in a peripheral region of a display area D. Signal lines 311 and 321 alternately connected to the data line shorting bars 310 and 320, signal lines 341 and 351 alternately connected to the gate line shorting bars 340 and 350, data lines 171 connected to the signal lines 311 and 321 through a contact portion C1, gate lines 121 connected to the signal lines 341 and 351 through a contact portion C2, a plurality of repair lines 331 and 332 enclosing a periphery of the display area D and having a loop shape, a plurality of assistance repair lines 333, 334, and 335 that intersect the repair lines 331 and 332 or not, and a guide ring 360 enclosing the outer of the cell region are also disposed in the cell region as illustrated in the exemplary embodiment shown in FIG. 3.

The data line shorting bars 310 and 320 are alternately connected to the signal lines 311 and 321, and a pad (not shown) for applying a test signal is formed on end portions of the shorting bars 310 and 320.

The gate line shorting bars 340 and 350 are alternately connected to the signal lines 341 and 351, a pad (not shown) for applying a test signal is formed on end portions of the shorting bars 340 and 350. The repair lines 331 and 332 are connected to the gate line shorting bars 340 and 350 through shorting points SP2 and SP1, respectively. Accordingly, the static electricity flowing in through the repair lines 331 and 332 is dispersed through the shorting bars 340 and 350 such that the static electricity in the display area D may be somewhat prevented. Also, a static electricity preventer "A" for conducting away the static electricity is provided in the repair lines 331 and 332.

The guide ring 360 disperses and stores the static electricity from the outside of the cell to prevent the thin film elements in the cell from being damaged by the static electricity.

The shorting bars 310, 320, 340, and 350, and the guide ring 360 are cut according to a cutting line L later.

The plurality of assistance repair lines 333 are formed on the upper side of the repair lines 331 and 332 disposed on the lower portion of the cell region. The plurality of assistance repair lines 334 are formed on the lower side of the repair lines 331 and 332 disposed on the lower portion of the cell region.

The plurality of assistance repair lines 333 extend in a transverse direction and include lines that are spaced apart from each other. The assistance repair lines 333 transmit data signals passing through the assistance repair line 335 and the repair lines 331 and 332 when the data lines 171 of a group including a predetermined number of data lines 171 are disconnected. In this case, the assistance repair line 335 is shorted to the assistance repair line 333 and the repair lines 331 and 332 through laser irradiation.

Next, the static electricity preventer "A" connected to the repair lines 331 and 332 will be described in detail with reference to FIG. 4, FIG. 5, and FIG. 6.

As shown in FIG. 4, both ends of a first detour line 41 are connected to the repair line 331 and both ends of a second detour line 42 are connected to the repair line 331. Another first detour line 41 and another second detour line 42 are similarly connected to the repair line 332. The first detour line 41 and the second detour line 42 are coupled in parallel. The first detour line 41 includes two resistors 44 that are coupled in series, and a plurality of diodes 43 are connected between the first detour line 41 and the repair line 331 and a plurality of diodes 43 are connected between the other first detour line 41 and the repair line 332. The cathodes of the diodes 43 are connected between the two resistors 44 of the first detour line 41. Here, the number of diodes 43 and the number of resistors 44 may be changed, and the second detour line 42 may be omitted.

The layered structure of the static electricity preventer "A" will now be described.

As shown in FIG. 5 and FIG. 6, two repair lines 331 and 332 are extended parallel to each other on an insulation substrate 110, and respective second detour lines 42 protrude from each of the repair lines 331 and 332 thereby forming the detour paths. Some details of the static electricity preventer "A", which are further described with respect to the repair line 332, are to be understood to apply to the repair line 331 in substantially the same manner. The repair line 332 has a plurality of control electrodes 431 that protrude. The second detour line 42 has a protrusion 421 for the connection along with the first detour line 41. The repair lines 331 and 332 and the second detour lines 42 are formed with the same layer as the gate lines 121 through the photolithography for the gate lines 121 of the display area D.

A gate insulating layer 130 is formed on the repair lines 331 and 332, and the second detour line 42.

A semiconductor 433 made of amorphous silicon is formed on the gate insulating layer 130 at a position overlapping the control electrode 431, and the first detour line 41 is formed. The first detour line 41 includes a contact portion 411 having a wide width for connection of an output electrode 412 and the protrusion 421, and is protruded toward the semiconductor 433 thereby being extended on the upper portion of the semiconductor 433. An ohmic contact layer 434 made of amorphous silicon doped with a high concentration of an n-type impurity is formed between the output electrode 412 and the semiconductor 433. The first detour line 41 is formed with the same layer as the data lines 171 through the photolithography of the data lines 171 of the display area D.

A passivation layer 180 is formed on the semiconductor 433 and the first detour line 41. The passivation layer 180 has a contact hole 182 exposing the contact portion 411 of the first detour line 41, and a contact hole 183 exposing the semiconductor 433. The passivation layer 180 and the gate insulating layer 130 have a contact hole 181 exposing the protrusion 421 of the second detour line 42 and a contact hole 184 exposing the control electrode 431.

A connection 441 connecting the protrusion 421 of the second detour line 42 and the contact portion 411 of the first detour line 41 through the contact holes 181 and 182, and an input electrode 435 connecting the semiconductor 433 and the control electrode 431 through the contact holes 183 and 184 are formed on the passivation layer 180. The connection 441 and the input electrode 435 are formed with the same layer as the pixel electrode of the display area D through the photolithography for the pixel electrode. Accordingly, they may be made of indium tin oxide (ITO) or indium zinc oxide (IZO) like the pixel electrode. This material has larger resistance than a metal material that may be used to form the first detour line 41 and the second detour line 42. Accordingly, the connection 441 functions as the resistor 44.

The control electrode 431, the input electrode 435, the output electrode 412, and the semiconductor 433 form a thin film transistor, and the control electrode 431 and the input electrode 435 are connected to each other thereby realizing the diode. The control electrode 431 and the input electrode 435 function as the anode, and the output electrode 412 functions as the cathode.

In the static electricity preventer "A", when the static electricity flows in through the repair lines 331 and 332, the resistor 44 provided by the connection 441 and/or the diode 43 provided by the control electrode 431, the input electrode 435, the output electrode 412, and the semiconductor 433, are destroyed, and the static electricity may be eliminated.

Figure 7:
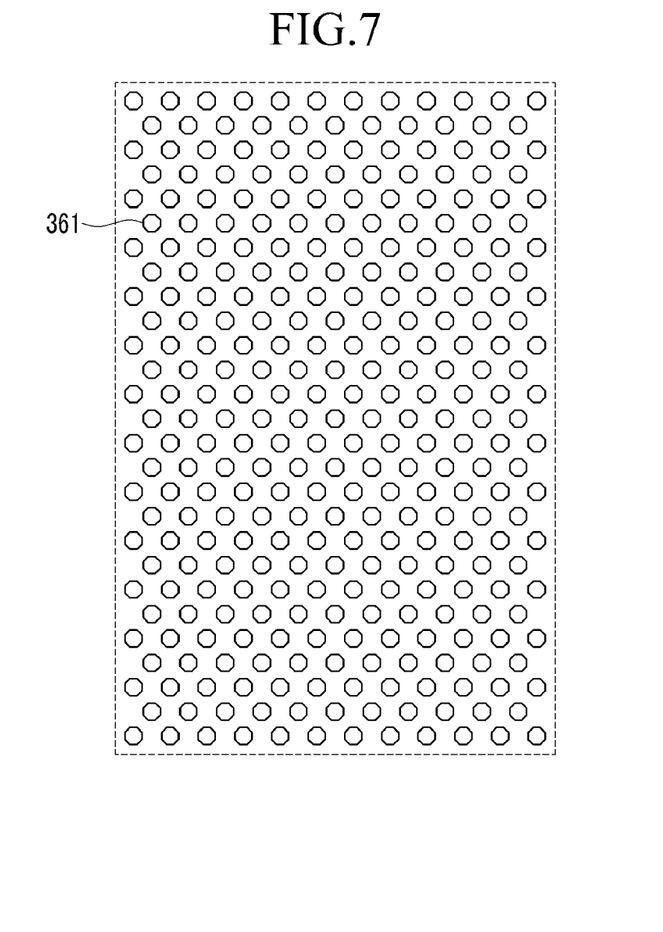
FIG. 7 is an enlarged view of the "B" portion shown in FIG. 3.

FIG. 7 is an enlarged view of the "B" portion of the liquid crystal display shown in FIG. 3.

As shown in FIG. 7, the guide ring 360 is made of a group of a plurality of point-type conductors 361 that are spaced apart from each other. The point-type conductors 361 may be equilaterally octagonal. The point-type conductors 361 form a plurality of capacitors such that they may disperse and store the static electricity when the static electricity flows in.

The guide ring 360 may be made with the same layer as the gate line 121 through the photolithography for the gate line 121.

When manufacturing the liquid crystal display, the mother substrate is divided into a single cell region or a plurality of cell regions, the gate lines 121, the data lines 171, the thin film transistors Q, and the pixel electrodes 190 are formed in the display area D of each cell region, and the repair lines 331 and 332, the static electricity preventer "A", and the guide ring 360 are formed in the peripheral area thereby, forming a mother substrate for the lower panel. Also, the mother substrate for the lower panel is combined to a mother substrate for the upper panel 200 manufactured through an additional process, and the mother substrates are divided into cell regions to complete the liquid crystal display. Here, the guide ring 360 is cut such that the guide ring 360 is separated from the cell region.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:
    a substrate comprising a display area and a peripheral area;
    a thin film transistor disposed in the display area;
    a gate line disposed in the display area and connected to the thin film transistor;
    a data line disposed in the display area and connected to the thin film transistor;
    a pixel electrode disposed in the display area and connected to the thin film transistor;
    a first repair line disposed in the peripheral area and being configured to repair when at least one of the gate line and the data line is disconnected; and
    a first detour line disposed in the peripheral area and comprising at least one first resistor having a higher resistance than a remaining portion of the first detour line, wherein the first detour line comprises two ends and both ends of the first detour line are connected to the first repair line.

2. The thin film transistor array panel of claim 1, further comprising:
    a first diode connected between the first detour line and the first repair line.

3. The thin film transistor array panel of claim 2, wherein the first resistor comprises two resistors that are coupled in series, and
    one terminal of the first diode is connected to the first detour line at a portion of the first detour line between the two resistors.

4. The thin film transistor array panel of claim 3, wherein a plurality of first diodes are connected between the first detour line and the first repair line.

5. The thin film transistor array panel of claim 4, further comprising:
    a second detour line disposed in the peripheral area and coupled in parallel with the first detour line, wherein the second detour line comprises two ends and both ends of the second detour line are connected to the first repair line.

6. The thin film transistor array panel of claim 5, further comprising:
    a second repair line disposed in the peripheral area and parallel to the first repair line;
    a third detour line disposed in the peripheral area and comprising at least one second resistor having a higher resistance than the remaining portion of the third detour line, wherein the third detour line comprises two ends and both ends of the third detour line are connected to the second repair line; and
    a second diode connected between the third detour line and the second repair line.

7. The thin film transistor array panel of claim 6, wherein the second resistor comprises two resistors that are coupled in series, and
    one terminal of the second diode is connected to the third detour line at a portion of the third detour line between the two resistors.

8. The thin film transistor array panel of claim 7, wherein a plurality of second diodes are connected between the third detour line and the second repair line.

9. The thin film transistor array panel of claim 8, further comprising:
    a fourth detour line disposed in the peripheral area and coupled with the third detour line in parallel, wherein the fourth detour line comprises two ends and both ends of the fourth detour line are connected to the second repair line.

10. The thin film transistor array panel of claim 9, wherein
    the first detour line comprises a first portion disposed with the same layer as the gate line and a second portion disposed with the same layer as the data line, and the first resistor comprises a connection disposed with the same layer as the pixel electrode and connecting between the first portion and the second portion, and
    the third detour line comprises a third portion disposed with the same layer as the gate line and a fourth portion disposed with the same layer as the data line, and the second resistor comprises a connection disposed with the same layer as the pixel electrode and connecting between the third portion and the fourth portion.

11. The thin film transistor array panel of claim 10, wherein the first diode and the second diode each further comprise:
    a control electrode disposed with the same layer as the gate line;
    a semiconductor disposed on the control electrode, and insulated from the control electrode;
    an input electrode disposed with the same layer as the pixel electrode and connected to the control electrode and the semiconductor; and
    an output electrode disposed with the same layer as the data line and connected to the semiconductor.

12. A thin film transistor array panel comprising:
    a substrate comprising a display area and a peripheral area;
    a thin film transistor disposed in the display area;
    a gate line disposed in the display area and connected to the thin film transistor;
    a data line disposed in the display area and connected to the thin film transistor;
    a pixel electrode disposed in the display area and connected to the thin film transistor;
    a first repair line disposed in the peripheral area and being configured to repair when at least one of the gate line and the data line is disconnected; and
    a first detour line disposed in the peripheral area, wherein the first detour line comprises two ends and both ends of the first detour line are connected to the first repair line, and
    wherein a first diode is connected between the first detour line and the first repair line.

13. The thin film transistor array panel of claim 12, further comprising:
    a second detour line disposed in the peripheral area and coupled with the first detour line in parallel, wherein the second detour line comprises two ends and both ends of the second detour line are connected to the first repair line.

14. The thin film transistor array panel of claim 13, further comprising:

a second repair line disposed in the peripheral area and parallel to the first repair line;

a third detour line disposed in the peripheral area, wherein the third detour line comprises two ends and both ends of the third detour line are connected to the second repair line; and a second diode connected between the third detour line and the second repair line.

* * * * *